United States Patent [19]
Kephart et al.

[11] 4,136,287
[45] Jan. 23, 1979

[54] INPUT PHASE MODULATION CORRECTION FOR CHARGE-TRANSFER-DEVICE ANALOG SHIFT REGISTERS

[75] Inventors: Gerald W. Kephart, Lakewood; Stanley A. White, Yorba Linda, both of Calif.

[73] Assignee: Rockwell International Corporation, El Segundo, Calif.

[21] Appl. No.: 751,633

[22] Filed: Dec. 17, 1976

[51] Int. Cl.$^2$ ............................................. G11C 19/28
[52] U.S. Cl. ............................ 307/221 D; 328/37; 328/167
[58] Field of Search ................... 307/221 C, 221 D; 357/24; 328/37, 162–165, 167

[56] References Cited
U.S. PATENT DOCUMENTS
3,999,171 12/1976 Parsons .......................... 307/221 D Primary Examiner—John Zazworsky
Attorney, Agent, or Firm—L. Lee Humphries; H. Fredrick Hamann; Rolf M. Pitts

[57] ABSTRACT

A device for correcting charge-transfer inefficiency-induced distortion in charge-transfer-device analog shift registers. The shift register successively samples a data line of interest, a voltage reference source and a null input. A variable time-delayed, synchronous inverter provides a-c coupling of the register so as to avoid bias content effects, and cancels the "tail" or terminal data smear induced by the charge-coupled device, the delay or phase of which inverter is adjusted during response of the charge-coupled device to a sampled null input. Additional compensation of the shift register output is also provided for gain changes thereof.

9 Claims, 4 Drawing Figures

INPUT PHASE MODULATION CORRECTION FOR CHARGE-TRANSFER-DEVICE ANALOG SHIFT REGISTERS

BACKGROUND OF THE INVENTION

The concept of the invention relates to means for improving the utility of charge-transfer-device type analog shift registers, and more particularly to apparatus for correction of charge-transfer-inefficiency induced distortion occurring in charge-transfer-device analog shift registers.

In the use of charge transfer devices as analog shift registers, it is known that data smear of the shift register response occurs. Such data smear or signal distortion is caused by charge transfer inefficiency in the charge transfer device cell, as is well known in the art, such phenomenon being discussed in the following U.S. patents:

U.S. Pat. No. 3,925,806 to Strain et al.
U.S. Pat. No. 3,868,516 to Buss
U.S. Pat. No. 3,946,248 to Buss
U.S. Pat. No. 3,963,942 to Sequin et al.
U.S. Pat. No. 3,919,468 to Weimer Such references also deal variously with means for processing the CCD shift register output to variously overcome limited aspects of the data smear, employing transversal filters and adaptive filters, as is more fully discussed in copending U.S. Application Ser. No. 728,690 filed Oct. 1, 1976 for Data Smear Compensation in Charge-Transfer-Device Analog Shift Registers assigned to Rockwell International Corporation, assignee of the subject patent application.

By means of the concept of the aforementioned copending application, an integrated arrangement is provided for the fuller correction of signal distortion occurring in a sampling shift register by means interposed at said output of the shift register, and comprising one of a recursive and transversal type network having a gated gain control input periodically coupled to the output of said shift register during the response thereof to a null signal reference for compensatorily cancelling the signal tail output of said shift register. Gain control compensatorily adjusts the signal level of the shift register output while a third means compensatorily biases the throughput of said shift register in response to sampled variations in the response thereof to a periodically nulling of the input of said shift register.

Such concept relies for success on how well the combinations of gain weightings preselected for the taps of the filters provide a reliable model of the charge-coupled-device (CCD) which is to be compensated thereby.

SUMMARY OF THE INVENTION

By means of the concept of the present invention, no reliance is placed upon an accurate modelling of the CCD, nor is a model thereof employed for compensation purposes. Instead, input time-phase modulation is employed to correct for charge-transfer device distortion induced by charge-transfer inefficiency. An adjustable-phase synchronous inverter or switching means synchronously chops the input and output of the shift register, the input time phase of the inverter being compensatorily adjusted to reduce the response of the shift register to a sampled null input. Gain control means is also included to compensate for gain changes introduced by the variable time delay or adjustable time phase and by the CCD itself.

By means of such input phase modulated, synchronous switching arrangement, compensation of data smear is effected and device gain variations overcome, whereby improved signal performance is obtained from the shift register device without the necessity of employing transversal or recursive or adaptive filtering. Also, because of the a-c coupling provided by such synchronous switching arrangement, signal bias content is avoided as to avoid the need for separate bias compensation means. In other words, a simpler structure is provided.

These and other objects of the invention will become apparent from the following description, taken together with the accompanying drawings, in which:

BRIEF DESCRIPTION OF THE DRAWINGS

Referring now to FIG. 1, there is illustrated a block diagram of a system in which the concept of the invention is to be advantageously employed. There is provided a charge coupled device type analog shift register 10 in cooperation with switches 11 and 12 for periodically sampling one or more data lines $13_1 \ldots 13_n$ and for providing an output sample to lines $14_1 \ldots 14_n$. Also associated with CCD structure 10 may be input signal conditioning circuitry such as sample and hold means 15a and 15b, as is well understood in the art. A representative sample of an analog signal sampled from one of lines $13_1$–$13_n$ resembles a rectangular pulse, of the sampled amplitude, corresponding, for example, to curve 33 of FIG. 2 at time $T_1$. Ideally, the (delayed) output of device 10 in response to such input would be of the same shape. However, due to the device charge transfer inefficiency in effecting charge transfer or signal translation of a stored signal sample, the signal output tends to develop a "tail" or exhibit smear, in the manner illustrated by curve 36 in FIG. 2. The output may also include a bias component and may further be subject to variations in gain or signal level.

Figure 1:
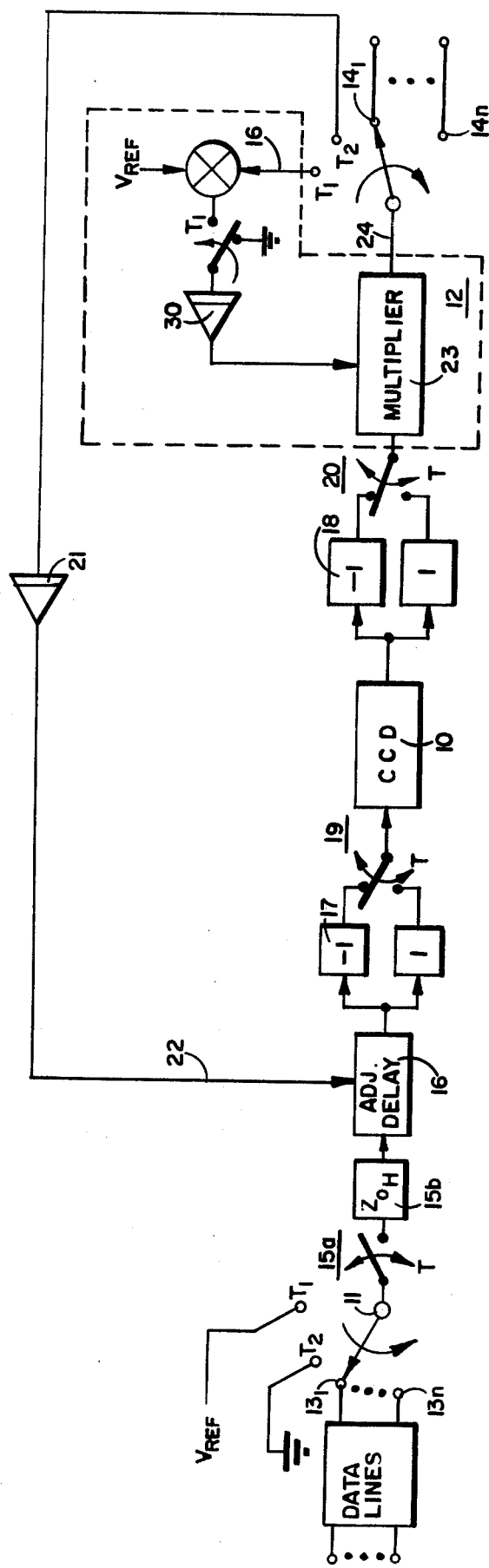
FIG. 1 is a block diagram of a system in which the concept of the invention is to be advantageously employed.

Accordingly, there is further included in the arrangement of FIG. 1 apparatus for the correction of the above-noted signal distortions. There is provided gain control means 23 interposed in series with the throughput of shift register 10 for adjusting the signal level thereof in response to sample variations in the response of shift register 10 to a periodically injected signal reference source, $V_{REF}$. Such periodic injection is provided by means of the periodic cooperation of sampling switch 11 at periodic sampling time $T_1$ with the reference source, $V_{REF}$, and CCD 10. In synchronous cooperation with switch 11 is switch 12 which couples the output of gain control means 23 to a gain control input 26 thereof during the response of CCD 10 to $V_{REF}$ to effect the desired compensatory gain control function. The details of the construction and arrangement of such gain control means 23 are identical to those disclosed in the above-noted co-pending application Ser. No. 728,690 filed Oct. 1, 1976. Such structural detail is seen from FIG. 1 to comprise a multiplier having a first input connected to the output of element 20 and further having an output 24. A second output of the multiplier is responsively connected to an output of an integrating amplifier 30. An input of integrating amplifer 30 is periodically connected to an output of a signal comparator or difference amplifier 27 by switching means operated in synchronism with periodic time $T_1$ of switch 12, the input of integrator 30 being otherwise grounded. At such sample time $T_1$ the output on line 24 is applied by switch 12 to a first input of comparator 27 for comparison with a reference signal $V_{REF}$, applied as a second input to comparator 27, such comparison being supplied as an input at time $T_1$ to integrator 30. The output of element 30, corresponding to the time integral of the applied inputs thereto, thus controls the gain of the multiplier, as is well understood in the art. The construction and arrangement of all of the elements illustrated and described as comprising dotted block 23 are well known to those skilled in the art and are therefore shown in block form only for convenience in exposition.

There is also included, in the arrangement of FIG. 1, synchronous inverter means with adjustable input time phase modulator means for cancelling the tail portion or smear in the output of shift register 10 in response to sampled variations in the response of shift register 10 to a periodic nulling of the input of shift register 10. Such synchronous inverter means includes a first signal inverter 17 and second signal inverter 18, and a first double-throw switch 19 and a second double-throw switch 20, switches 19 and 20 being operated in synchronism with the system sampling rate. First switch 19 and inverter 17 cooperate to alternately phase-invert the applied input to CCD element 10, while second switch 20 and second inverter 18 cooperate to alternately phase-invert the output of CCD element 10. The construction, arrangement and cooperation of such synchronous inverter means is well understood in the art as indicated by the disclosure in U.S. Pat. No. 3,424,990 for Synchronous Demodulating means and issued Jan. 28, 1969 to A. S. Escobosa.

The adjustable input time phase modulation means of FIG. 1 comprises a voltage-controlled time phase modulator 16 interposed in input series circuit with first switch 19 and first inverter 17. The construction and arrangement of a time modulator is shown in further detail in FIG. 3.

Figure 3:
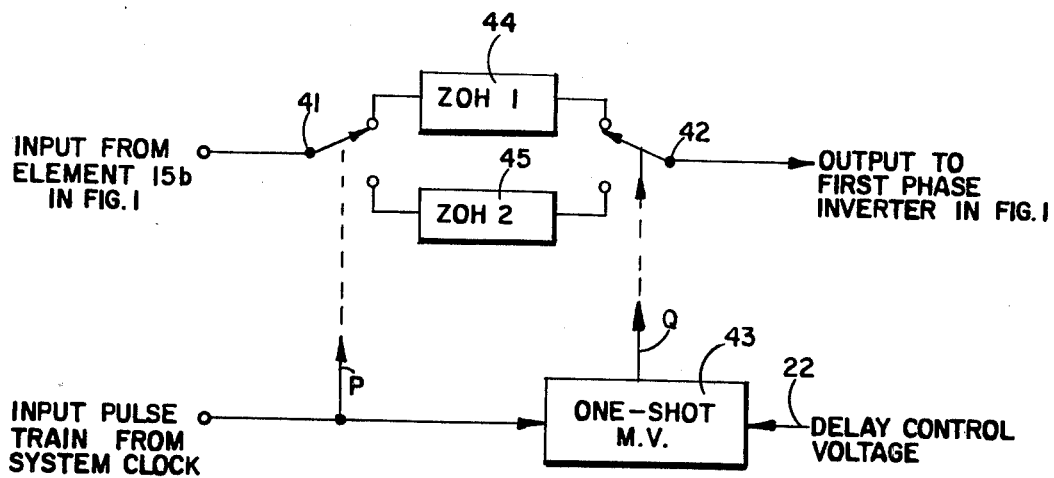
FIG. 3 is a block diagram of the time modulator or voltage controlled delay element of FIG. 1.

Referring to FIG. 3, there is illustrated in block diagram form an embodiment of the voltage-controlled time-phase modulator 16 of FIG. 1. There is provided first and second double-throw switching means 41 and 42, each having a switching control input thereof coupled to a system clock or common source (not shown) of input pulses, P or Q, for switching the switching means 41 or 42 to alternate switching states in response to successive switch control input pulses. The armature terminal of first switch means 41 corresponds to the input to element 16 (in FIG. 1) from element 15b, while the armature terminal of second switch means 42 corresponds to the output of element 16 in FIG. 1. A one-shot multivibrator 43 is interposed between the switching control inputs of switches 41 and 42 for selectively delaying the switching of second switch 42 relative to first switch 41, a control input 22 of multivibrator 43 comprising the control input 22 of time modulator 16 (of FIG. 1). Such variable delay multivibrators are well known in the prior art, as indicated by element 52 in U.S. Pat. No. 3,640,628. There is further provided in FIG. 3 first and second zero-order-hold devices 44 and 45, each connected across a respective switched terminal of switching means 41 and 42, the inputs of elements 44 and 45 being connected to mutually exclusive switched terminals of first switching means 41.

Figure 4:
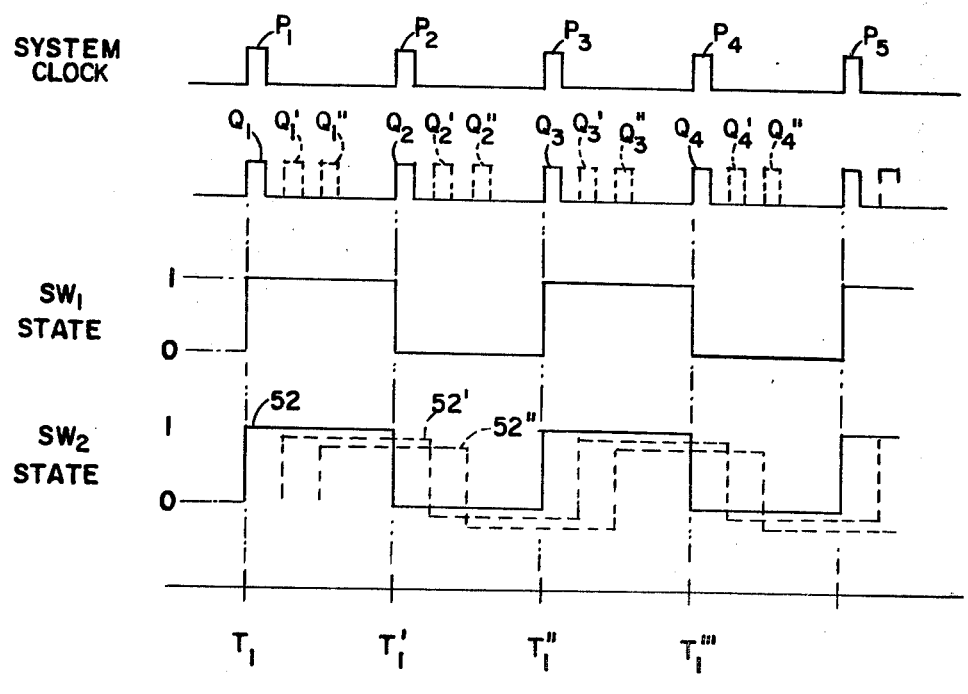
FIG. 4 is a family of time histories of the responses of various elements in the embodiment of FIG. 3.

Referring to FIG. 4, in normal operation of the arrangement of FIG. 3 the switching state ($SW_1$) of switch 41 (curve 51) is changed in synchronism with system clock pulses $P_1$-$P_2$, while the time phase of the switching state changes of switch 42 (curves 52, 52' or 52" alternatively) in synchronous response to the pulsed output of multivibrator 43 (curves $Q_1$, $Q_1'$ or $Q_1''$ alternatively) is varied by varying the voltage level applied to the control input 22 of element 43 (in FIG. 3). Thus, it is clear that the waveform of curve 51 (in FIG. 4) is reproduced with a variable time phase as curve 52 by the voltage controlled time-phase modulator of FIGS. 1 and 3.

Referring again to FIG. 1, there is further provided a signal integrator 21 having an output coupled to a control input 22 of modulator 16 and further having an input coupled to the (synchronously inverted) output response of CCD 10 to a sampled or periodic null input. Such periodic nulling is provided by means of the periodic cooperation of sampling switch 11 with shift register 10 at periodic sampling time $T_2$ to ground or null the input thereto. In synchronous cooperation with switch 11, switch 12 couples the output of gain control means 23 to an input of integrator 21 during the response of shift register 10 to the applied null input. Any variation in the shift register output from a null, in response to the applied null input, is deemed indicative of the presence of signal error or data smear. Such error is observed and remembered by element 21 and applied to the control input 22 of voltage controlled time-phase modulator 16 in such sense to effectively null the average output of CCD 10 to such null input.

In normal operation of the device of FIG. 1, sequential switching signals generated by electronic clocking means well understood in the art will synchronously operate stepping switches 11 and 12, to sequentially step or switch to an AGC sample mode ($T_1$), a phase modulation control mode ($T_2$) (which latter mode is employed to perform the tail-cancelling function), and successive ones of a plurality of sampled signal lines in successive sampling intervals. Referring to the family of time histories in FIG. 2, curve 31 at time $T_1$ represents a $T_1$ sampling signal for switches 11 and 12 and the switched input to element 15a, while curve 32 at time $T_2$ represents a $T_2$ sampling signal for switches 11 and 12 and the switched input to integrator 21. Similarly, subsequent sampling control signals (by clock means not shown but well understood in the art) would effect control of the sampling of the sampled data lines by sampling switches 11 and 12.

By superposition, tail portions of a prior data sample may be present in the read-out of subsequent data samples. However, similarly by means of superposition, the variable-delay synchronous inverter arrangement serves to cancel each contribution made by each sampling of the data through the use of an input time-delay modulator responsive to the synchronously inverted output of CCD 10 during an applied null input sample provided by switch 11 at time $T_2$. By sampling the synchronously inverted output of CCD 10 during null sample time $T_2$, only a "tail" response (to a previous sample) is present in the CCD output. Now if, by manipulation of the CCD input a null output can be provided during null input sample time $T_2$, then the "tail" or subsequent data smear (of a preceding signal sample) will have been cancelled. Such manipulation or cancellation is effected by variation or control of delay element 16.

Referring again to FIG. 2 at $T_1$, for example, the $V_{REF}$ output sample of zero-order-hold 15b (curve 33 at $T_1$) is subjected to a delay by adjustable time-phase modulator 16 (curve 34 between $T_1$ and $T_2$), while the cooperation of switch 19 and inverter 17 (synchronously) invert every other (delayed) data sample fed to CCD 10 (curve 35A and 35B). Thus, the effect of the delay and inversion is to "slop" a portion of the input sample of one synchronous time slot into the following synchronous time slot, which slopped portion is inverted or of opposite sense as the parent sample.

The effect of such delay and inversion on the data sample "tail" generation by CCD 10 may be viewed by examining the effects of the successive sample portions (curves 35A and 35B) separately. The "tail" generated by component input 35A (in FIG. 2) is represented by curve 36. Note that the initial amplitude response ($T_1$-$T_2$) is attenuated relative to each of curves 33 and 34 due to the energy splitting caused by such delay and chopping (corresponding to the lesser area under curve 35A relative to curve 34).

Figure 2:
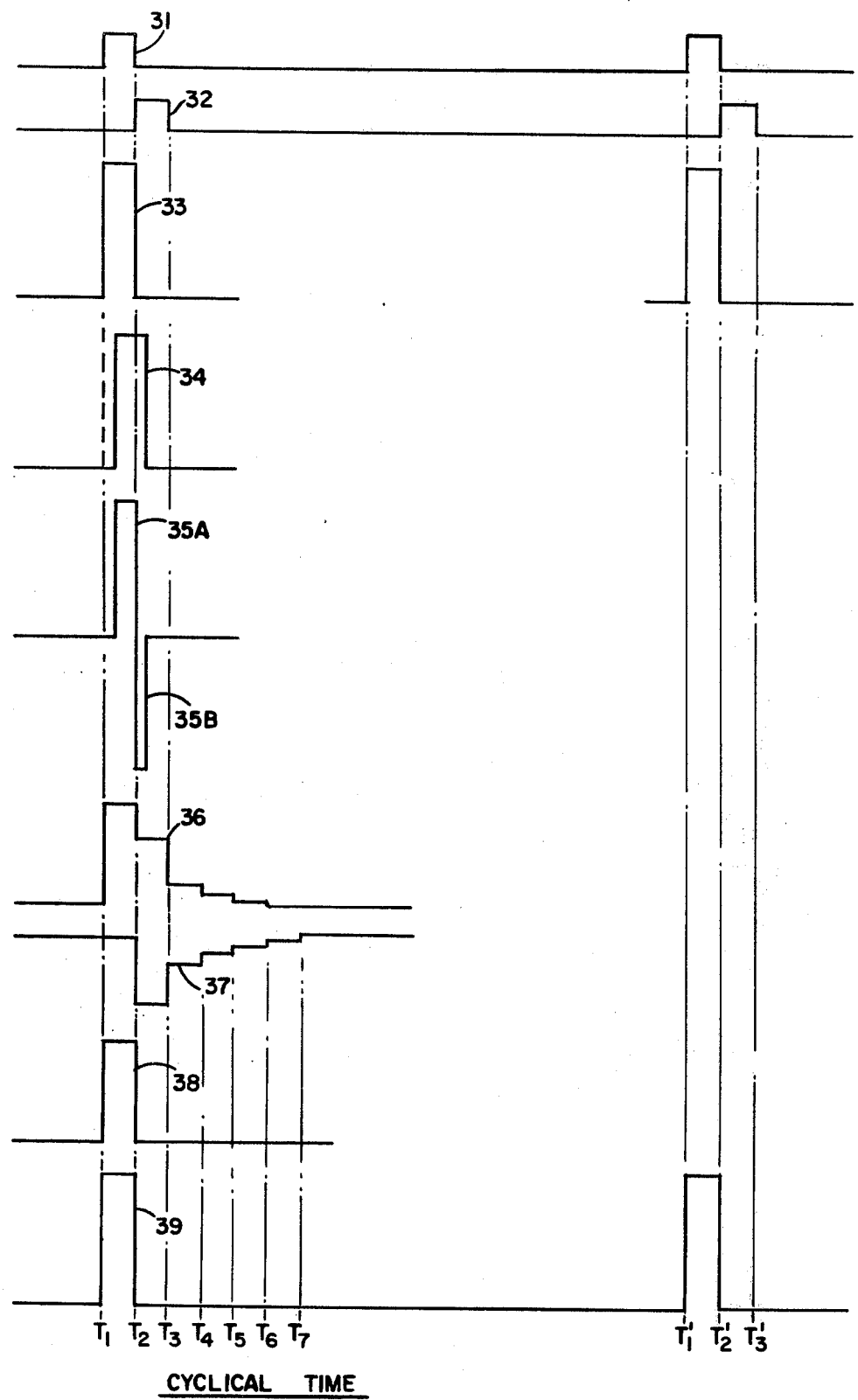
FIG. 2 is a family of time histories of the responses of various elements in the embodiment of FIG. 1.

The pulse and "tail" generated by CCD 10 in response to component input 35B to CCD 10 is represented in FIG. 2 by curve 37. Such response is attenuated (as well as delayed and inverted) relative to curve 36 due to the lesser energy level represented by the area above curve 35B, relative to curve 35A as well as curve 34. The sum of curves 36 and 37, corresponding to the synchronously inverted output of CCD 10 at switch 20, is described by curve 38. By adjustment of time modulator 16 in accordance with the time integral of the sense and magnitude of the input to integrator 21, during the interval $T_2$-$T_3$, the difference or synchronously inverted output at switch 20 during such interval can be maintained at a null. In such preferred adjustment, the combined pulse and "tail" of curve 37 equal and oppose the "tail" of curve 36 (between $T_2$ and $T_6$, say) as to provide the clean pulse or residue represented by curve 38 between $T_1$ and $T_2$.

The resultant output from CCD 10 is thus modulated (attenuated) in intensity. Synchronous inversion of the A-C output of CCD 10 by the cooperation of switch 20 and inverter 18 provide the reconstituted and attenuated waveform of curve 38 (in FIG. 2), while the AGC unit restores the gain or level thereof (curve 39) from a comparison of the level of curve 38 to the reference $V_{REF}$ level (at cyclical time $T_1$).

Thus, the CCD data smear or "tail" is applied successive input data samples are oppositely combined in CCD 10 as to tend to cancel each other. Such cancellation is improved by adjustment of the time delay provided by voltage controlled phase modulator 16, the adjustment being made as a function of the response of integrator 21 to the sense and amplitude of reconstituted CCD output occurring on synchronous inverter output line 24 in response to an applied null input to switch 11 (at time $T_2$). In other words, the time-averaging response of integrator 21 to the output "tail" sample present at null input sample time $T_2$ serves to control the adjustable input time phase so as to apportion the sample "slop" between successive CCD data input samples in such a proportion as to result in mutual cancellation of the data smear or "tail" contained in such alternatively inverted successive samples.

Also, because of the synchronous inversion or synchronous chopping of such data samples, any bias in the data output is not coupled through (e.g., similarly tends to be cancelled). Any bias occurring in the CCD device is converted to an A-C square wave output by output chopper elements 18 and 20, the time-averaged response of multiplier AGC means 23 to which is null.

In the operation of switches 11 and 12 at the synchronous sampling rate, whereby data sequentially sampled from a successive one of lines $13_1$-$13_n$ is transferred to a corresponding one of lines $14_1$-$14_n$, and also the response to the reference voltage applied at periodic time $T_1$ and the null applied at periodic time $T_2$ by switch 11 are sampled at such period times by switch 12, it is obviously necessary that the nominal signal transport delay interposed between such signalling stations be equal to an integer multiple of the cyclical sampling period, — the time interval to affect two successive samples of line $13_1$, for example. Such matching of the cyclical switching to the signal delay is well understood in the art of signal multiplexing and may be conveniently achieved by selection of the number of shift register stages in the shift register device to match the transport delay therethrough with the cyclical switching period, or else to adjust the time phase of the output cyclical switching period (to match the shift register transport delay) by changing such phase relative to that of the input synchronous switching period, or both. Such matters are of design choice and, in any event, do not relate to novel aspects of the invention disclosed herein.

Accordingly, there has been described means for improving the performance of CCD-type analog shift registers by compensation of the data smear or signal distortion normally induced by charge transfer inefficiency and also for bias content and gain variations. Although the invention has been disclosed and illustrated in detail, it is to be clearly understood that the same is by way of illustration and example only and is not to be taken by way of limitation, the spirit and scope of this invention being limited only by the terms of the appended claims.

We claim:

1. A device for the correction of signal tail distortion occurring in an analog sampling shift register and comprising synchronous phase inverter means in series circuit cooperation with adjustable input time phase modulation means having a modulation control input responsive to a synchronous phase inverted output of said shift register during the response thereof to an applied null input to compensate for tail-end data smear of signal samples sampled by said shift register.

2. The device of claim 1 in which there is further provided gain compensation means responsively coupled to the synchronously phase-inverted output of said register for compensatorily adjusting the signal level thereof in response to output variations thereof to a sampled signal reference source periodically injected at said phase modulated input of said shift register.

3. The device of claim 1 in which said synchronous phase inverter means comprises:
a first and second signal inverter
a first and second double-throw switch, said switches being arranged to operate in synchronism, said first switch and first inverter cooperating to alternately phase-invert the applied input to said analog shift register, said second switch and said second inverter cooperating to alternately phase-invert the output of said analog shift register.

4. The device of claim 3 in which a voltage controlled time-phase modulator is interposed in series circuit with said first switch and first inverter, and in which there is further provided a signal integrator output coupled to the control input of said modulator and further having a gated input coupled to the synchronously inverted output response of said shift register to said applied sampled null input.

5. The device of claim 4 in which said adjustable time phase modulator comprises first and second double-throw switching means, each having a switch control input for alternating switching states in response to successive switch control input pulses from a common system clock, a one-shot multivibrator interposed between the switching control inputs of said switching means for selectively delaying the switching of the second switching means relative to said first switching means, said multivibrator having a control input terminal comprising the control input of said modulator, a first and second zero-order-hold device, each connected across a respective switched terminal of said first and second switching means, the inputs of said zero-order-hold devices being connected to mutually exclusive switched terminals of said first switching means.

6. A device for the correction of signal distortion occurring in an analog sampling shift register and comprising in combination synchronous phase inverter means interposed in series with the throughput of said shift register for a-c coupling the output level thereof in response to applied inputs thereto, variable time-phase modulation means for compensatorily adjusting the input time phase of said shift register in response to sampled variations in the response thereof to a periodic nulling of the input of said shift register, and gain control means interposed at said a-c coupled output of said shift register for compensatorily adjusting the signal level thereof in response to sample variations in the response thereof to a periodically injected signal reference source.

7. The device of claim 6 in which said modulation means is comprised of a voltage controlled time phase modulator interposed at said input of said shift register, and a signal integrator having an output coupled to a control input of said modulator and having an input responsive to the synchronously inverted output of said shift register during response of said shift register to periodic nulling of the shift register input, whereby the input phase of said shift register is compensatorily adjusted in such a sense as to provide a null average output during said periods of shift register response to said periodic nulling.

8. The device of claim 7 in which said voltage controlled time phase modulator comprises first and second double-throw switching means, each having a switch control input for alternating switching states in response to successive switch control input pulses from a common system clock, a one-shot multivibrator interposed between the switching control inputs of said switching means for selectively delaying the switching of the second switching means relative to said first switching means, said multivibrator having a control input terminal comprising the control input of said modulator, a first and second zero-order-hold device, each connected across a respective switched terminal of said first and second switching means, the inputs of said zero-order-hold devices being connected to mutually exclusive switched terminals of said first switching means.

9. The device of claim 6 in which said gain control means is comprised of a signal multiplier having a first input responsive to a synchronous phase inverted output of said shift register, and a signal integrator having an output coupled to a second input of said multiplier and further having an input responsive to the sampled difference between said signal reference source and an output of said multiplier for adjusting the gain of said multiplier in such sense as to reduce said difference.

* * * * *